United States Patent
Borthakur

(10) Patent No.: US 12,300,708 B2
(45) Date of Patent: May 13, 2025

(54) GAPLESS IMAGE SENSOR PACKAGES AND RELATED METHODS

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 576 days.

(21) Appl. No.: 17/572,106

(22) Filed: Jan. 10, 2022

(65) Prior Publication Data

US 2023/0223415 A1 Jul. 13, 2023

(51) Int. Cl.
*H01L 27/146* (2006.01)

(52) U.S. Cl.
CPC .. *H01L 27/14623* (2013.01); *H01L 27/14621* (2013.01); *H01L 27/14627* (2013.01); *H01L 27/14632* (2013.01); *H01L 27/14685* (2013.01)

(58) Field of Classification Search
CPC ..... H01L 27/14; H01L 27/144; H01L 27/146; H01L 27/14601; H01L 27/14603; H01L 27/14605; H01L 27/14607; H01L 27/14609; H01L 27/1461; H01L 27/14612; H01L 27/14614; H01L 27/14616; H01L 27/14618; H01L 27/1462; H01L 27/14621; H01L 27/14623; H01L 27/14625; H01L 27/14627; H01L 27/14629; H01L 27/1463; H01L 27/14632; H01L 27/14634;

(Continued)

(56) References Cited

U.S. PATENT DOCUMENTS 7,576,401 B1 8/2009 de Guzman et al.
10,018,929 B2 * 7/2018 Kawasaki .......... G03G 15/0121
(Continued)

FOREIGN PATENT DOCUMENTS

| CN | 105870145 | 8/2016 |
| CN | 112992698 | 6/2021 |
| DE | 102018133660 | 3/2020 |

OTHER PUBLICATIONS

Lin, et al., Encapsulated Wafer Level Chip Scale Package (eWLCSP) for Cost Effective and Robust Solutions in FlexLine, 2014 IEEE International Microsystems, Packaging, Assembly and Circuits Technology Conference (IMPACT), 2014, 5 pages.

*Primary Examiner* — John R Lee
(74) *Attorney, Agent, or Firm* — IPTechLaw LLC

(57) ABSTRACT

Implementations of image sensor packages may include: an image sensor die including a first largest planar side and a second largest planar side; an optically transmissive cover including a first largest planar side and a second largest planar side where the second largest planar side coupled to the first largest planar side of the image sensor die using an adhesive; and a light block material that fully covers edges of the image sensor die located between the first largest planar side and the second largest planar side of the image sensor die and fully covers edges of the optically transmissive cover between the first largest planar side and the second largest planar side of the optically transmissive cover. The light block material may extend across a portion of the first largest planar side and second largest planar side of the optically transmissive cover.

20 Claims, 9 Drawing Sheets

(58) Field of Classification Search
CPC ......... H01L 27/14636; H01L 27/14638; H01L 27/1464; H01L 27/14641; H01L 27/14643; H01L 27/14645; H01L 27/14647

See application file for complete search history.

(56) References Cited

U.S. PATENT DOCUMENTS

| | | | |
|---|---|---|---|
| 10,418,396 B1* | 9/2019 | Wu | H01L 27/14632 |
| 10,734,437 B2* | 8/2020 | Chen | H01L 27/14625 |
| 10,784,298 B2* | 9/2020 | Dong | H01L 31/0203 |
| 10,868,061 B2* | 12/2020 | Wu | H01L 27/14687 |
| 10,890,491 B2* | 1/2021 | Valouch | H01L 31/09 |
| 11,036,067 B2* | 6/2021 | Skorka | G02F 1/1339 |
| 11,063,078 B2 | 7/2021 | Hsu | |
| 11,193,821 B2* | 12/2021 | Herard | G01J 1/0271 |
| 11,309,343 B2* | 4/2022 | Natori | H01L 27/14625 |
| 11,462,580 B2* | 10/2022 | Skeete | H01L 27/14627 |
| 11,756,973 B2 | 9/2023 | Hsu | |
| 11,783,619 B2* | 10/2023 | Zhang | G02B 5/005 |
| 11,869,912 B2* | 1/2024 | Hsieh | H01L 27/14625 |
| 12,051,711 B2* | 7/2024 | Hsu | H01L 27/14685 |
| 2006/0145325 A1* | 7/2006 | Yang | H01L 27/14625 257/680 |
| 2008/0042227 A1* | 2/2008 | Asano | H01L 31/0203 257/E31.127 |
| 2008/0211045 A1 | 9/2008 | Ono | |
| 2009/0190009 A1* | 7/2009 | Kawasaki | H01L 27/14618 438/69 |
| 2009/0243051 A1 | 10/2009 | Vanam et al. | |
| 2010/0053407 A1* | 3/2010 | Crisp | H01L 24/14 257/E31.097 |
| 2013/0149805 A1* | 6/2013 | Chuang | H01L 27/14618 438/65 |
| 2014/0110807 A1 | 4/2014 | Uekawa | |
| 2016/0322273 A1 | 11/2016 | Wu et al. | |
| 2017/0294477 A1* | 10/2017 | Chen | H01L 27/14632 |
| 2017/0345864 A1* | 11/2017 | Kinsman | H01L 27/14636 |
| 2018/0114804 A1 | 4/2018 | Hsieh | |
| 2018/0331142 A1 | 11/2018 | Yamamoto et al. | |
| 2019/0096938 A1 | 3/2019 | Hsieh | |
| 2019/0195685 A1 | 6/2019 | Herard et al. | |
| 2019/0277703 A1* | 9/2019 | Valouch | G01J 5/04 |
| 2019/0305023 A1* | 10/2019 | Wu | H01L 27/14618 |
| 2019/0363122 A1* | 11/2019 | Wu | H01L 27/14687 |
| 2020/0052020 A1* | 2/2020 | Wu | H01L 31/02005 |
| 2020/0312897 A1* | 10/2020 | Hsieh | H01L 27/14618 |
| 2020/0411573 A1* | 12/2020 | Skeete | H01L 24/08 |
| 2020/0411576 A1* | 12/2020 | Hsu | H01L 27/14623 |
| 2021/0005655 A1* | 1/2021 | Kawazoe | H01L 27/1464 |
| 2021/0026164 A1* | 1/2021 | Skorka | H04N 25/13 |
| 2021/0098518 A1* | 4/2021 | Wu | H01L 31/0203 |
| 2021/0343772 A1* | 11/2021 | Hsu | H01L 27/14685 |
| 2022/0020800 A1* | 1/2022 | Hsieh | H01L 27/14625 |
| 2022/0102406 A1 | 3/2022 | Xi et al. | |
| 2023/0064356 A1* | 3/2023 | Lin | H01L 27/14698 |
| 2023/0223415 A1* | 7/2023 | Borthakur | H01L 27/14623 257/431 |
| 2023/0378209 A1* | 11/2023 | Neo | H01L 27/14618 |
| 2024/0030265 A1* | 1/2024 | Wu | H01L 27/14618 |
| 2024/0038805 A1* | 2/2024 | Hsieh | H01L 27/14625 |
| 2024/0167873 A1* | 5/2024 | Vaartstra | H01L 27/14618 |

* cited by examiner

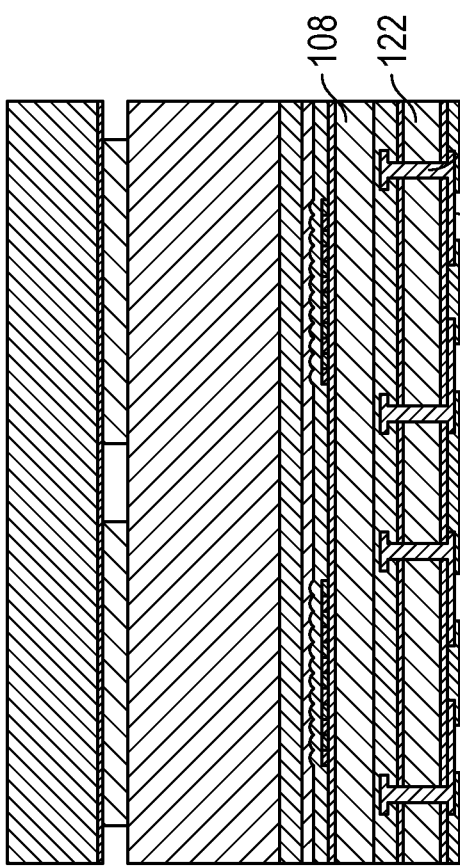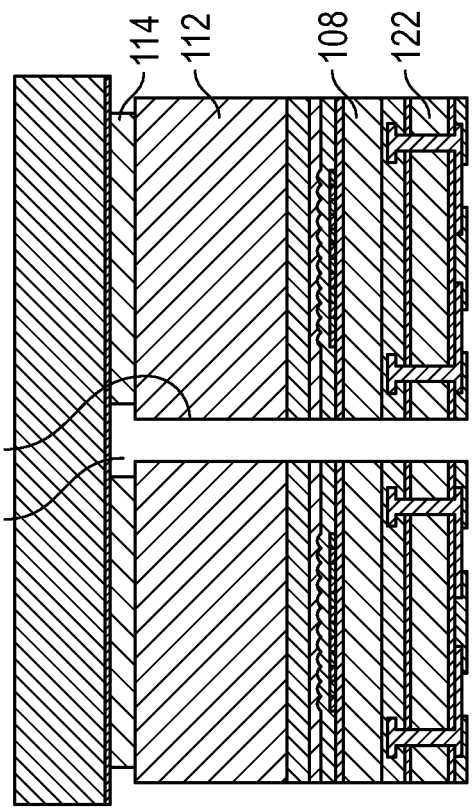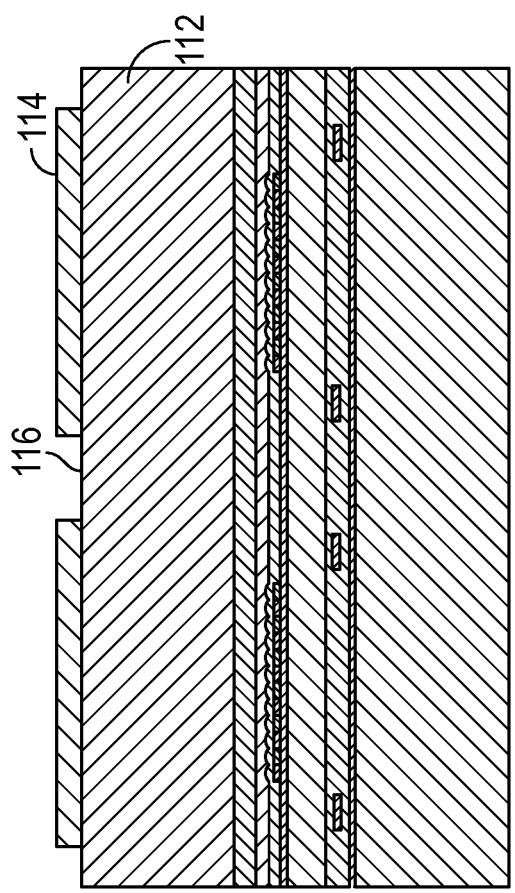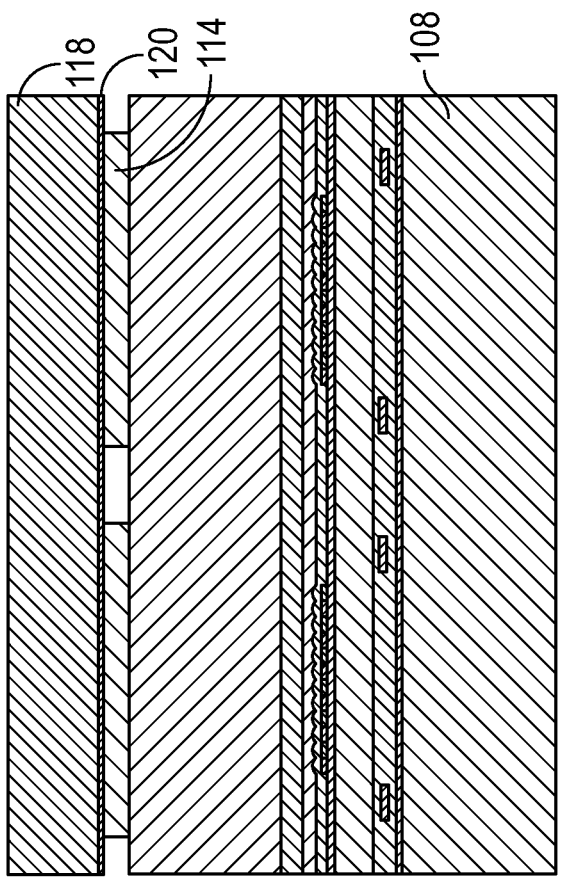

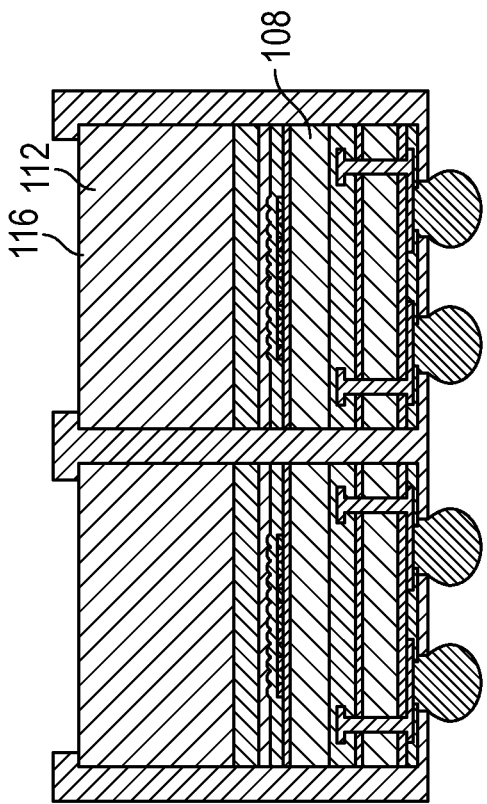
FIG. 19
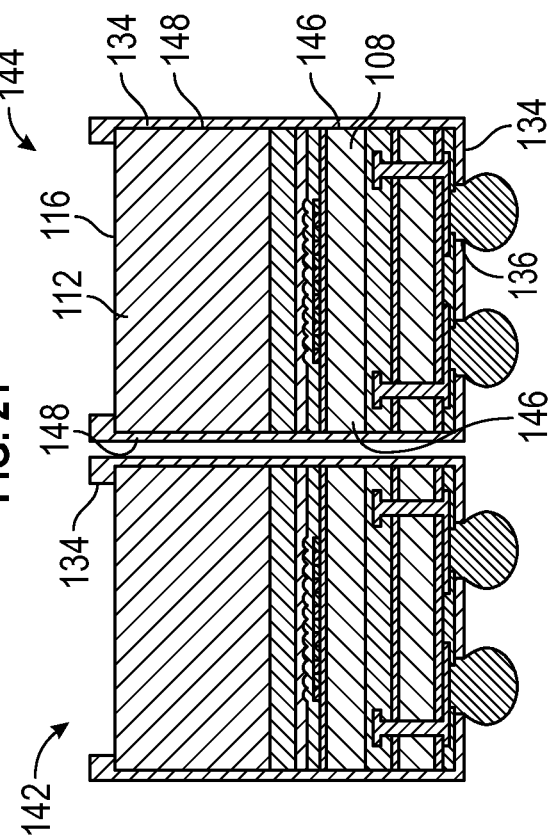
FIG. 21
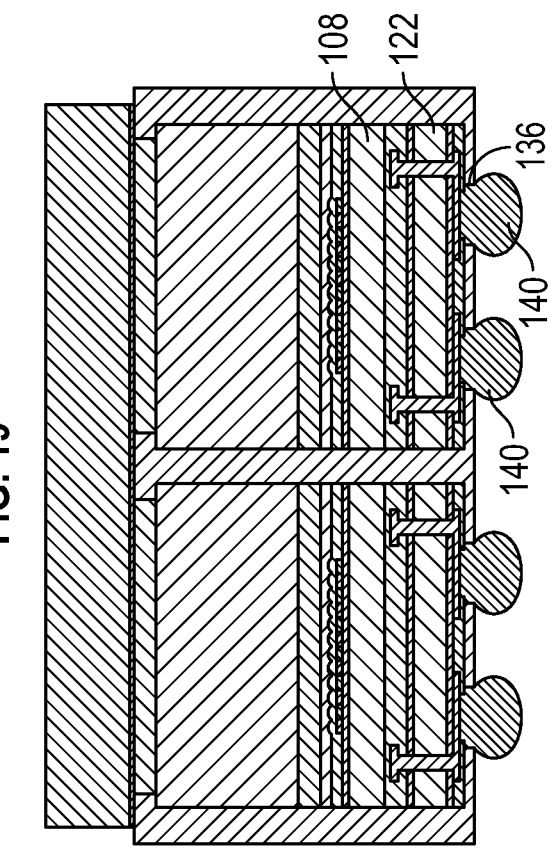
FIG. 20
FIG. 22

GAPLESS IMAGE SENSOR PACKAGES AND RELATED METHODS

BACKGROUND

1 Technical Field

Aspects of this document relate generally to image sensors, such as devices for detecting electromagnetic radiation. More specific implementations involve packages for image sensors.

2. Background

Image sensors include semiconductor devices designed to detect electromagnetic radiation and output electrical signals in response. Packages for image sensors are designed to protect the image sensors and allow for transmission of the electrical signal outputs. Image sensor packages generally provide for transmission of electromagnetic radiation to the image sensor as well.

SUMMARY

Implementations of image sensor packages may include: an image sensor die including a first largest planar side and a second largest planar side; an optically transmissive cover including a first largest planar side and a second largest planar side, the second largest planar side coupled to the first largest planar side of the image sensor die using an adhesive; and a light block material that fully covers edges of the image sensor die located between the first largest planar side and the second largest planar side of the image sensor die and fully covers edges of the optically transmissive cover between the first largest planar side and the second largest planar side of the optically transmissive cover. The light block material may extend across a portion of the first largest planar side of the optically transmissive cover. The light block material may extend across a portion of the second largest planar side of the image sensor die.

Implementations of image sensor packages may include one, all, or any of the following:

The package may include a second light block material that extends across a portion of the second largest planar side of the optically transmissive cover.

The package may include a microlens array.

The microlens array may be formed only of an organic material.

The package may include a plurality of bumps surrounded by the light block material.

The light block material may extend fully across the entire second largest planar side of the image sensor die except at a location of each of a plurality of bumps.

The plurality of bumps may be electrically coupled with the image sensor portion of the image sensor die through one or more through silicon vias and a redistribution layer.

The package may include a second die bonded to the second side of the image sensor die and the light block material may fully cover edges of the second die located between a first largest planar side and a second largest planar side of the second die.

Implementations of a method of forming an image sensor package may include providing an image sensor die including a first largest planar side and a second largest planar side; coupling an optically transmissive cover including a first largest planar side and a second largest planar side to the first largest planar side of the image sensor die using an adhesive at the second largest planar side of the optically transmissive cover; and patterning a first light block material on the first largest planar side of the optically transmissive cover. The method may include coupling a carrier to the first largest planar side of the optically transmissive cover over the first light block material; forming one or more electrical interconnects between an image sensor portion of the image sensor die and the second largest planar side of the image sensor die; and singulating through a thickness of the image sensor die and through a thickness of the optically transmissive cover into the first light block material to form a plurality of openings. The method may include applying a second light block material into the plurality of openings and over the second largest planar side of the image sensor die; forming one or more openings in the second light block material; forming one or more bumps into the one or more openings in the second light block material; decoupling the carrier; and singulating through the second light block material.

Implementations of a method of forming an image sensor package may include one, all, or any of the following:

The method may include forming a color filter array and a microlens array on the first largest planar side of the image sensor die.

The second light block material may fully cover edges of the image sensor die located between the first largest planar side and the second largest planar side of the image sensor die and may fully cover edges of the optically transmissive cover between the first largest planar side and the second largest planar side of the optically transmissive cover.

The first light block material may extend across a portion of the first largest planar side of the optically transmissive cover.

The second light block material may extend across a portion of the second largest planar side of the image sensor die.

The method may include forming an gap between the optically transmissive cover and the image sensor die when coupling the optically transmissive cover to the first largest planar side of the image sensor die using the adhesive.

The method may include forming a patterned light block material on the optically transmissive cover prior to forming the air gap.

Implementations of a method of forming an image sensor package may include providing an image sensor die including a first largest planar side and a second largest planar side; coupling an optically transmissive cover including a first largest planar side and a second largest planar side to the first largest planar side of the image sensor die using an adhesive at the second largest planar side of the optically transmissive cover; and coupling a carrier to the first largest planar side of the optically transmissive cover. The method may include forming one or more electrical interconnects between an image sensor portion of the image sensor die and the second largest planar side of the image sensor die; singulating through a thickness of the image sensor die and through a thickness of the optically transmissive cover to form a plurality of openings; applying a light block material into the plurality of openings and over the second largest planar side of the image sensor die; and forming one or more openings in the light block material. The method may include forming one or more bumps into the one or more openings in the light block material; decoupling the carrier; and singulating through the light block material.

Implementations of a method of forming an image sensor package may include one, all, or any of the following:

The method may include where the light block material fully covers edges of the image sensor die located between the first largest planar side and the second largest planar side of the image sensor die and fully covers edges of the optically transmissive cover between the first largest planar side and the second largest planar side of the optically transmissive cover.

The light block material may extend across a portion of the first largest planar side of the optically transmissive cover.

The light block material may extend across a portion of the second largest planar side of the image sensor die.

The method may include forming an gap between the optically transmissive cover and the image sensor die when coupling the optically transmissive cover to the first largest planar side of the image sensor die using the adhesive.

The method of claim may include forming a patterned light block layer on the optically transmissive cover prior to forming the air gap.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 15 is a cross sectional view of the device implementation of FIG. 14 following patterning of an adhesive layer on the optically transmissive cover;

FIG. 16 is a cross sectional view of the device implementation of FIG. 15 following coupling of a carrier to the adhesive layer;

FIG. 17 is a cross sectional view of the device implementation of FIG. 16 following formation of a plurality of electrical interconnects;

FIG. 18 is a cross sectional view of the device implementation of FIG. 17 following singulation down to the carrier;

FIG. 19 is a cross sectional view of the device implementation of FIG. 18 following application of a light block material into the openings formed during singulation;

FIG. 20 is a cross sectional view of the device implementation of FIG. 19 following formation of a plurality of bumps into openings in the light block material;

FIG. 21 is a cross sectional view of the device implementation of FIG. 20 following removal of the carrier and the adhesive layer;

FIG. 22 is a cross sectional view of the device implementation of FIG. 21 following singulation through the light block material to form image sensor packages;

DESCRIPTION

This disclosure, its aspects and implementations, are not limited to the specific components, assembly procedures or method elements disclosed herein. Many additional components, assembly procedures and/or method elements known in the art consistent with the intended image sensor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor packages, and implementing components and methods, consistent with the intended operation and methods.

Figure 1:
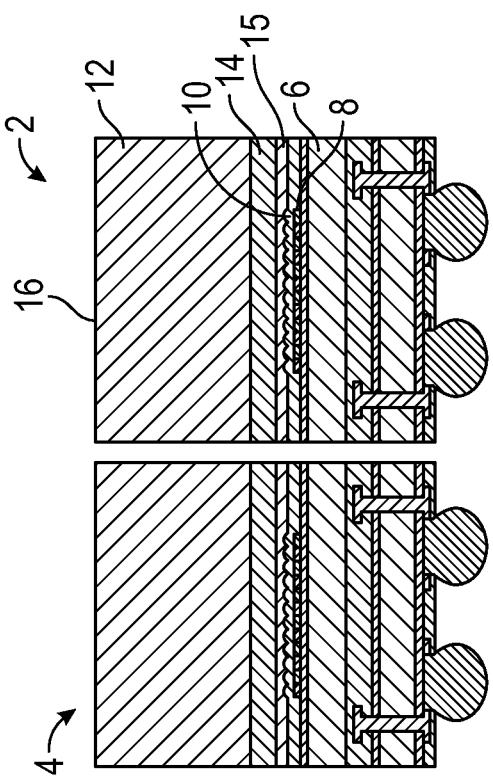
FIG. 1 is a cross sectional view of first implementations of semiconductor packages.

Referring to FIG. 1, implementations of two image sensor packages 2, 4 are illustrated following singulation. As illustrated, these packages include a semiconductor image sensor die 6 which has had a color filter array 8 and micro lens array 10 coupled thereto. The color filter array 8 and micro lens array 10 are coupled over a portion of the image sensor die that contains an array of photodiodes designed to receive and process electromagnetic radiation, such as, by non-limiting example, infrared radiation, ultraviolet radiation, visible light radiation, X-rays, or any other electromagnetic radiation type. The color filter array and micro lens array may be any of a wide variety of such structures depending upon the image sensor die type formed using various processing methods. An optically transmissive cover 12 is coupled over the micro lens array 10 through the use of an adhesive 14 and a low refractive index material 15 to produce a gapless image sensor package device. Low refractive index material is added above the microlens to enable focusing of the electromagnetic radiation. If the adhesive 14 and the microlenses 10 are made of materials with the same refractive index, then, without a low refractive index material interposed between them, the microlenses 10 will lack any electromagnetic radiation focusing ability. Examples of law refractive index materials include materials with a refractive index of 1.2 at a 550 nm light wavelength. For such a low refractive index material, the microlenses 10 and the adhesive may each have a refractive index of 1.5 at a 550 nm light wavelength. In various implementations, the microlenses may be made of only an organic material.

One of the challenges present in the image sensor packages 2, 4 is that electromagnetic radiation can enter the edges of the packages formed by the cross section sides (thicknesses) of the optically transmissive cover 12 and the image sensor die 6. This can occur through the package experiencing scattered, diffuse, or directed electromagnetic radiation that encounters the package at an angle not perpendicular to the largest planar surface 16 of the optically transmissive cover 12. This electromagnetic radiation can reflect and be otherwise reflected or channeled to the photodiode region and can contribute to various kinds of flare appearing in the images processed using the signals produced by the image sensor (petal, halo, edge, etc.). The surface of the optically transmissive cover, the edges of the optically transmissive cover, and the surface of the substrate material of the image sensor die can specifically contribute to flare in a gapless image sensor package design like that illustrated in FIG. 1.

Figure 2:
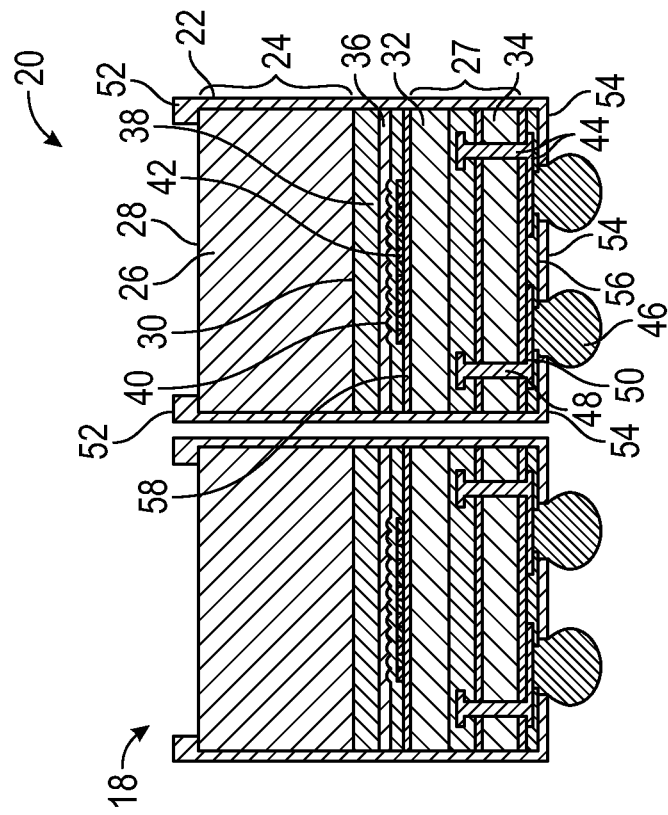
FIG. 2 is a cross sectional view of second implementations of semiconductor packages.

Referring to FIG. 2, implementation of two image sensor packages 18, 20 are illustrated. In these image sensor packages, 18, 20, a light block material 22 is present that extends completely across the edges 24 of an optically transmissive cover 26 that has a first largest planar side (into the paper) 28 and a second largest planar side (into the paper 30). The light block material 22 also extends completely across the edges 27 of an image sensor die 32 that has a first largest planar side/surface 58 and a second largest planar side 56 included in the package. In the package implementation 20 illustrated in FIG. 2, there are two semiconductor die included in the package, the image sensor die 32 and another semiconductor die 34 which may be, by non-limiting example, an application specific integrated circuit (ASIC), a digital signal processor, memory, a processor, or any other semiconductor die. In some implementations, the die 34 may be a portion of a carrier used for supporting the image sensor die 32 during previous processing steps and the material may be any used for the carrier, including, by non-limiting example, silicon, glass, or any other substrate material or combination of substrate materials or layers of materials. As illustrated, the light block material 22 also completely covers the edges of the other semiconductor die 34. Where stacked die are included in implementations of image sensor packages disclosed herein, the term "image sensor die" as used herein, for the purposes of simple explanation, includes the image sensor die, any stacked die, any bonding materials between the die, any associated layers (color filter array, microlenses, low refractive index materials) and any redistribution layer associated with electrical connections for the die.

As illustrated, the light block material 22 covers the edges of any other layers present in the image sensor package with the optically transmissive cover 26 and the image sensor die 32 including (as previously defined) any low refractive index layer(s) 36, adhesive layer(s) 38, microlens array 40, and/or color filter array 42 depending on whether one, all, or any of these are present in particular image sensor implementations. The implementation illustrated in FIG. 2 includes all of these layers and additional metallization layers associated with a plurality of electrical interconnects 44 part of a redistribution layer formed in the package to allow the image sensor die 32 and the die 34 to be electrically connected with bumps 46. In the package implementation 20 illustrated in FIG. 2, the electrical interconnects 44 include through silicon/through oxide vias 48 in combination with various traces 50 that collectively form a redistribution layer. In various implementations that do not include stacked die, the use of silicon vias may be used to connect to the pads on the image sensor die in combination with various traces for the redistribution layer or substrate to form electrical interconnects with the bumps. In some implementations, bumps may not be used and pins or pads may be utilized instead depending on the interconnect scheme employed by a particular circuit board to which the image sensor package will be coupled.

As illustrated in FIG. 2, the light block material 22 has portions 52 that extend across a portion of the surface of the largest planar side 28 of the optically transmissive cover 26. In a square die, the portions 52 would extend across all portions of the square perimeter of the square die. Also, the light block material 22 has portion 54 that covers the second largest planar side 56 (into the paper) of the image sensor die 32 (in this case again counting both die 32 and 34 as a single die and any redistribution layers as part of the die for the purposes of convenience). The bumps 46 extend through openings in the light block material 22 where the portion 54 does not cover the second largest planar side 56. In some implementations, except for the openings in the light block material 22, the light block material 22 covers the entire surface of the second largest planar side 56.

Because the light block material 22 fully covers all of the exposed edges of the package (all four sides for a square package design) and portions of the first largest planar surface 28 of the optically transmissive cover 26 along with the second largest planar surface 56 of the die 32 not occupied with bumps 46, electromagnetic radiation can only enter the package through the exposed portion of the first largest planar surface 28. Because of this, the ability for electromagnetic radiation to reflect internally inside the package is significantly reduced because the reflected radiation is most likely to encounter the light block material 22 before being able to reflect again. Because of the use of the light block material 22 and its positioning around the surfaces of the image sensor package, significantly less flare (or potentially no flare) may be observed during operation of the packages.

Figure 3:
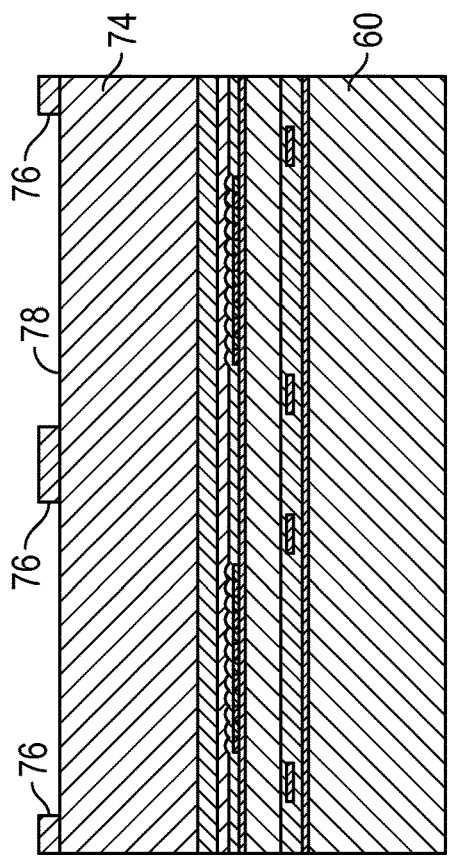
FIG. 3 is a cross sectional view of an implementation of a semiconductor device following formation of a color filter array and micro lens array.

The various implementations of image sensor packages 18, 20 illustrated in FIG. 2 may be manufactured using implementations of various methods of forming image sensor packages like those disclosed herein. Referring to FIG. 3, an implementation of an array of image sensor die 60 is illustrated following formation of color filter arrays 62 and micro lens arrays 64 thereon and the application of a low refractive index material 66 over the micro lens arrays 64.

Figure 4:
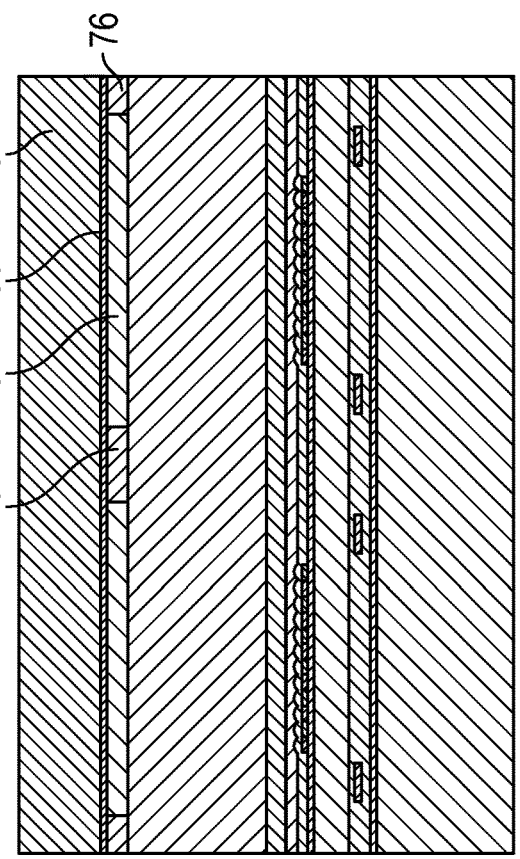
FIG. 4 is a cross sectional view of the device implementation of FIG. 3 following coupling of an optically transmissive cover thereto.
Figure 5:
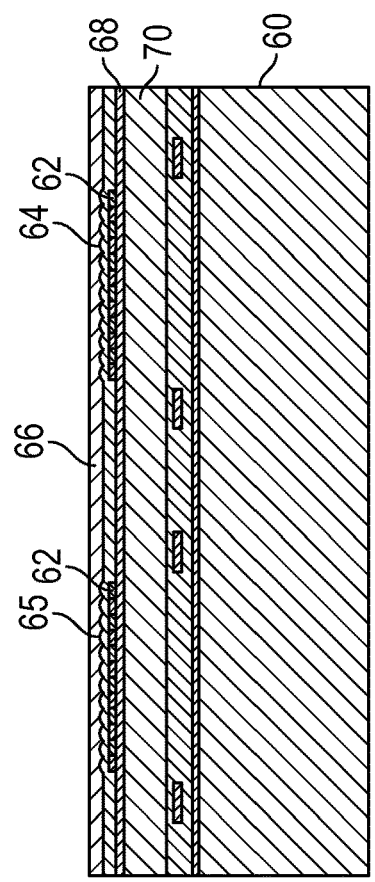
FIG. 5 is a cross sectional view of the device implementation of FIG. 4 following patterning of a light block material on the optically transmissive cover.
Figure 6:
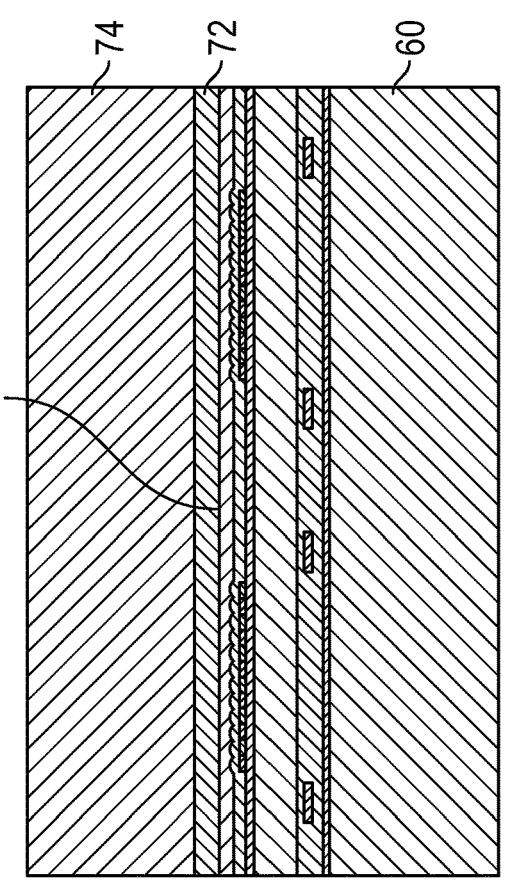
FIG. 6 is a cross sectional view of the device implementation of FIG. 5 following coupling of a carrier over the patterned light block material.

Referring to FIG. 4, the array of image sensor die 60 is illustrated following application of a layer of adhesive 72 and the coupling/bonding of an optically transmissive cover 74 to what, for the purposes of convenience, forms a first largest planar side 80 of the array of image sensor die 60 to form an array of gapless image sensors. FIG. 5 illustrates a patterned layer of first light block material 76 formed in desired locations on the first largest planar side 78 of optically transmissive cover 74. The location of the patterned portions of the first light block material 76 is designed to align with the die street regions that separate each image sensor die of the array of image sensor die 60. The material of the first light block material 76 may be patterned using any of a wide variety of processes and techniques in various method implementations. For example, where the material is photosensitive or can be photosensitized, lithographic light expose and develop processes may be used to pattern the first light block material. Where the material is not photosensitive, various lithographic processes employing photoresist and etching may be employed. In other implementations, screen printing, spray coating, or stencil printing of the first light block material may be used to form the patterned portions. In various implementations, a descumming/cleaning process may be utilized following formation of the patterning to ensure the surface of the optically transmissive cover 74 is clean. In various implementations the descumming/cleaning process may be an oxygen plasma ash/clean.

Following the formation of the patterned first light block material 76, a layer of planarizing material is then applied to fill the gaps between the portions of the material 76. This planarization layer 82 acts to permit accurate and level coupling of a carrier 84 via a layer of release material 86 designed to ultimately permit releasing of the carrier 84 at a later point in the process. The material of the planarization layer 82 is selected to allow it to be removed selectively relative to the light block material 76 through any of a wide variety of removal processes in later processing, including, by non-limiting example, etching, ashing, solvent washing, and any other selective material removal process.

Figure 7:
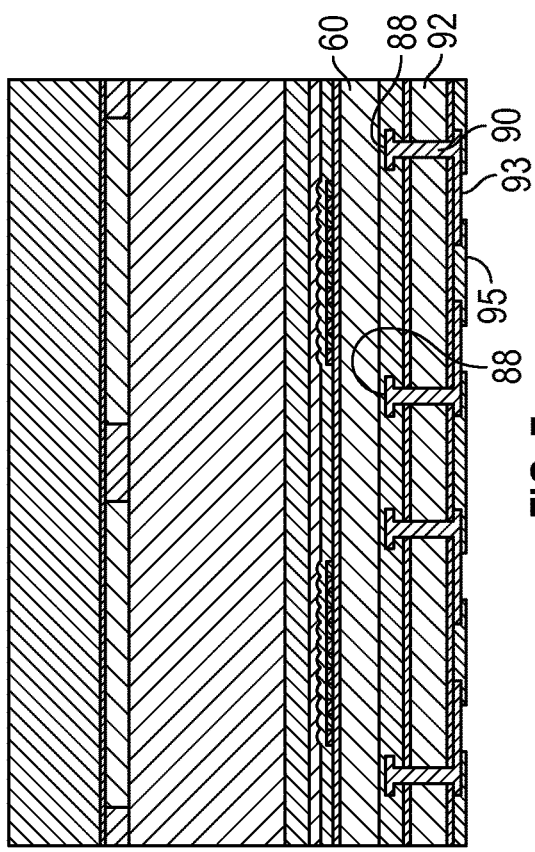
FIG. 7 is a cross sectional view of the device implementation of FIG. 6 following formation of a plurality of electrical interconnects.

Referring to FIG. 7, the array of image sensor die 60 is illustrated following processing to form various types of electrical interconnects. For the package illustrated in FIG. 7, the array of image sensor die 60 were bonded at a wafer level with ASIC die 92 previous to beginning packaging processing. In that process, in various implementations, the die were electrically connected through a hybrid bonding process (not shown) which included copper to copper bonding, the copper being formed in a matrix of silicon dioxide. During the packaging processing steps, the array of image sensor die which were already bonding to the ASIC die were flipped 180 degrees from the orientation illustrated in FIG. 7 so the carrier 84 is facing down and various semiconductor processing operations are then carried out, depending on the particular package being formed. The ASIC die 92 were first thinned through a backgrinding or other thinning process. Through silicon/through oxide vias 90 were formed through the material of the array of ASIC die 92 to establish connections with pads 88 of the ASIC die 92. The ASIC die 92 in FIG. 7 are illustrated as being already connected to the array of image sensor die 60 through the copper to copper hybrid bonds (not specifically illustrated in FIG. 7). In these various method implementations additional processing steps may be carried out to form traces 93 and pads 95 that are part of a redistribution layer to allow electrical connections to the various bumps which will be formed later on. While in the implementation illustrated in FIG. 7 the use of through silicon/through oxide vias 90 is illustrated, the electrical interconnects may be vias that connect directly to pads on the image sensor die, particularly where the use of stacked die is not used and just the image sensor die themselves are included in the package. A wide variety of different stacked and non-stacked die configurations, along with the associated electrical interconnects and redistribution layers may be utilized in the various method implementations disclosed herein.

Figure 8:
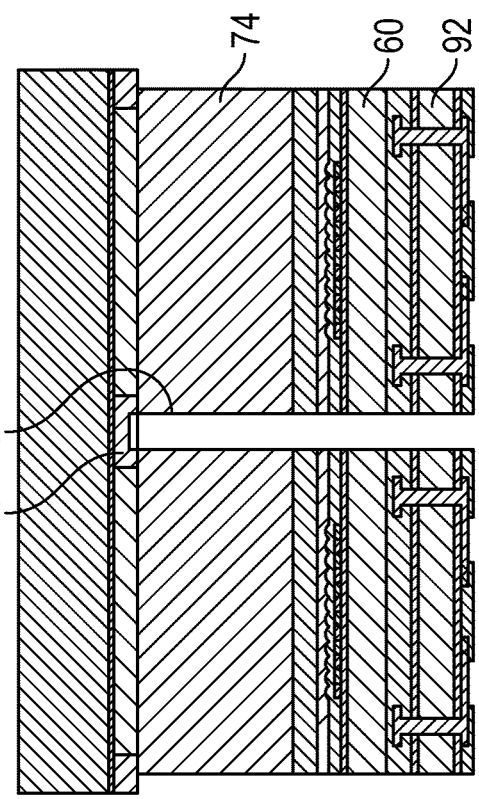
FIG. 8 is a cross sectional view of the device implementation of FIG. 7 following cutting into the device down to the light block material through the optically transmissive cover.

Referring to FIG. 8, the array of image sensor die 60 are illustrated following a singulation step that cuts through the array of ASIC die 92, the array of image sensor die 60, and the full thickness of the optically transmissive cover 74 down to the level of the first light block material 76. As illustrated, the singulation may go into the material of the first light block material 76, but in other implementations, the singulation may go all the way through the material of the first light block material 76 as well. The singulation may be carried out using, by non-limiting example, sawing, laser ablating, etching, or any combination thereof in various method implementations. The singulation may also be a two-step process with a first larger/wider saw cut followed by a smaller/thinner saw cut that creates a stepped structure along the cut edges of the singulation region.

Figure 9:
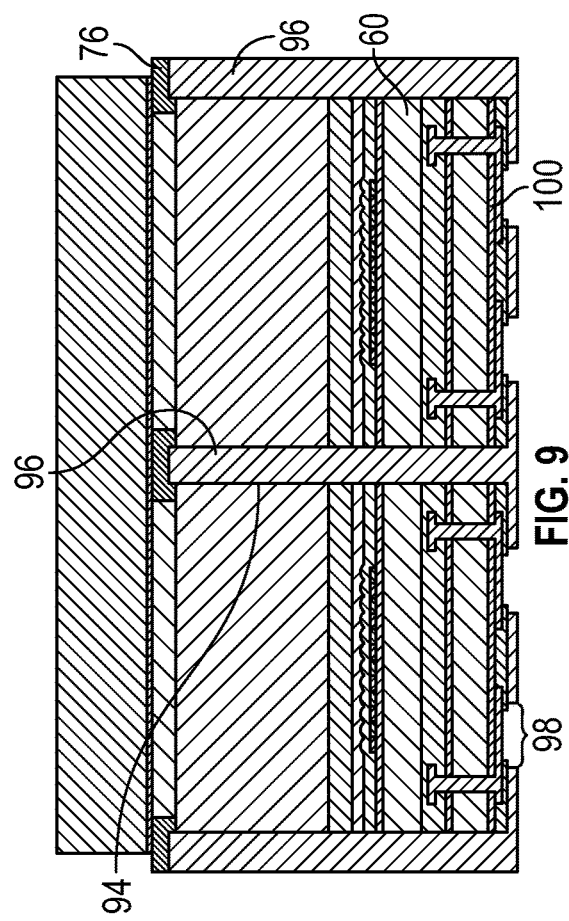
FIG. 9 is a cross sectional view of the device implementation of FIG. 8 following application of a second light block material into the openings formed by cutting.

FIG. 9 illustrates that after the singulation step, the openings 94 are then filled with a second light block material 96. It must be kept in mind that the drawing illustrated in FIGS. 9-12 is not to scale, as in particular package implementations the aspect ratio/fill ratio of the openings 94 is about 1:6 where the die street/scribe line width is about 80 microns and the depth of the openings 94 is about 500 microns to about 600 microns. These fill ratios are within the range of capabilities of various processes used for filling the openings 94 with the second light block material 96. In one implementation, the use of vacuum lamination of a negative black dry film photoresist as the second light block material may be carried out, followed by a lithographic expose and develop step to create openings 98 in the material of the second light block material 96. In various implementations, a final cure of the second light block material may be implemented at this point. Note that this process allows for the initial covering of the entire second largest planar side 100 of the array of image sensor die 60 with the second light block material 96. Following creation of the openings 98, the second light block material 96 remains, covering the rest of the second largest planar side 100. In another implementation, spin coating of the second light block material 96 may be used to fill the openings 94 followed by the use of a lithographic patterning process followed by an etching process to form the openings 98. Where the material of the second light block material 96 is photodefinable when being spin coated, only an exposure and develop process with a final cure may be needed to form the openings 98. In various implementations, the material of the first light block material 76 may be the same material as that used for the second light block material 96. In other implementations, however, different material types may be used. The material of the bumps may be printed (screen printing) or the material may be plated (and reflowed in the case of solder bumps) depending on the bump materials used.

Figure 10:
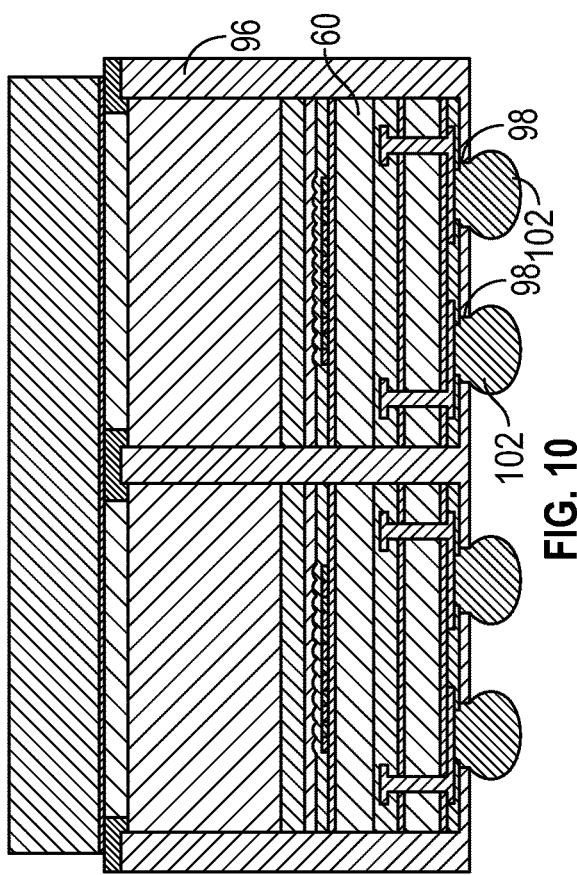
FIG. 10 is a cross sectional view of the device implementation of FIG. 9 following formation of a plurality of bumps into openings in the second light block material.

Referring to FIG. 10, the array of image sensor die 60 is illustrated following the formation of a plurality of bumps into the openings 98 of the second light block material 96. A wide variety of bump types may be utilized in various implementations, including, by non-limiting example, solder bumps, copper bumps, copper stud bumps, or any other bump or stud-type interconnect type. The corresponding process for forming the particular bump utilized is employed to form the bumps in various package formation method implementations.

Figure 11:
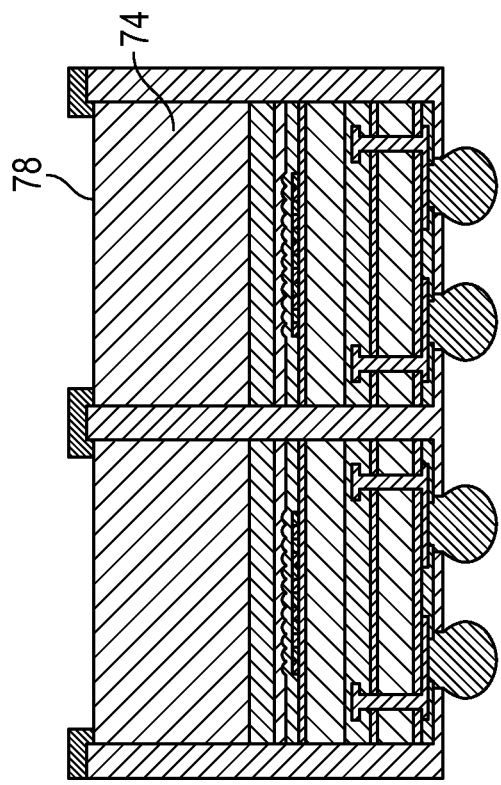
FIG. 11 is a cross sectional view of the device implementation of FIG. 10 following removal of the carrier.
Figure 12:
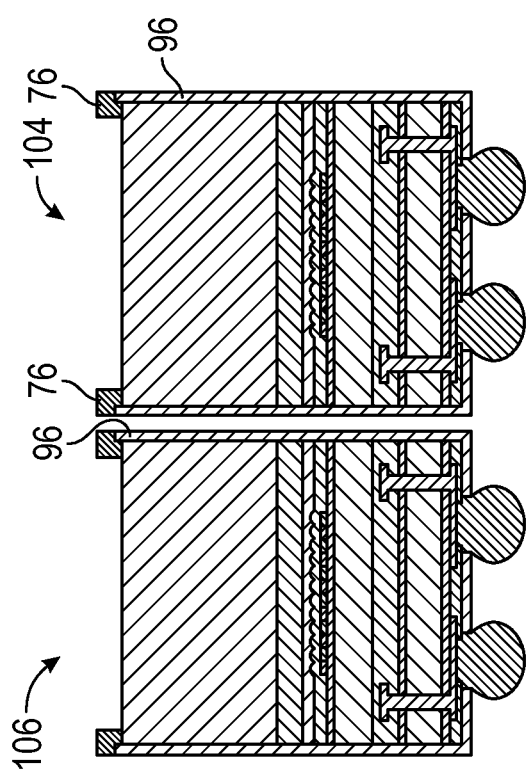
FIG. 12 is a cross sectional view of the device implementation of FIG. 11 following singulation through the first and second light block materials to form image sensor packages.

Referring to FIG. 11, the array of image sensor die 60 is illustrated following removal of the carrier 84 using the material of the release layer 86 and removal of the planarizing layer 82. In a particular implementation, the release layer 86 may be a UV sensitive material that weakens/breaks down when exposed to UV light through the material of the carrier 84 thus allowing the carrier 84 to release. In particular implementations, a solvent clean followed by an oxygen plasma descumming process may be used to clean the first largest planar side 78 of optically transmissive cover 74 following release of the carrier 84. FIG. 12 illustrates image sensor packages 104, 106 following singulation through the material of the first light block material 76 and the second light block material 96. This singulation may take place using various singulation techniques, including, by non-limiting example, sawing, scribing, laser ablating, etching, or any combination thereof.

Figure 13:
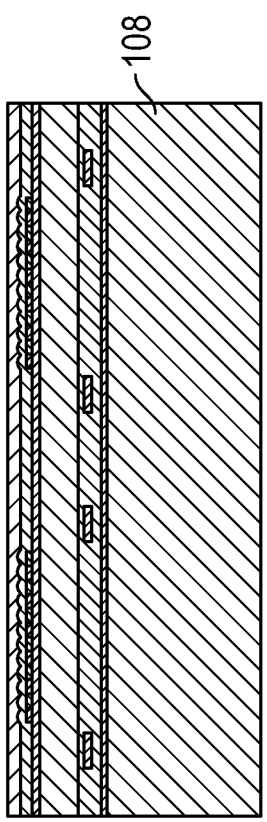
FIG. 13 is a cross sectional view of an implementation of a semiconductor device following formation of a color filter array and a micro lens array.
Figure 14:
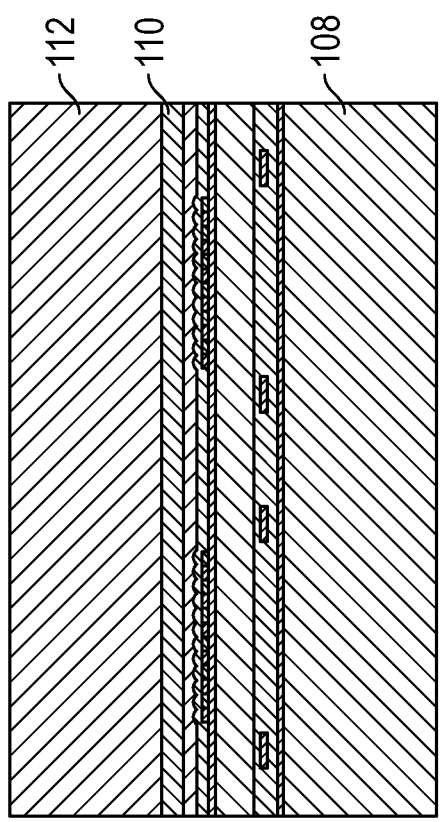
FIG. 14 is a cross sectional view of the device implementation of FIG. 13 following coupling of an optically transmissive cover thereto.

Image sensor packages like those disclosed herein may be manufactured using other method implementations. Referring to FIGS. 13 and 14, an array of image sensor die 108 (which may be any image sensor die type with corresponding layers disclosed herein), is illustrated following coupling through a layer of adhesive 110 to optically transmissive cover 112. Referring to FIG. 15, a temporary adhesive 114 is patterned onto the first largest planar side 116 of the optically transmissive cover 112. FIG. 16 illustrates the array of image sensor die 108 following coupling of a carrier 118 to the temporary adhesive 114 using a release layer 120. The patterning of the adhesive layer 114 may be carried out using any of the patterning methods disclosed in this document.

Referring to FIG. 17, the array of image sensor die 108 are illustrated after processing to form various electrical interconnects. Any of the various processing steps and interconnect types previously discussed with respect to the implementation illustrated in FIG. 8 may be carried out, including the various thinning, bonding, and via formation operations. In the implementation illustrated in FIG. 17, the array of image sensor die 108 have been bonded to an array of ASIC die 122, thinned, and through silicon/through oxide vias 124 used to electrically connect to the ASIC die. The ASIC die is connected to the sensor die through copper to copper hybrid bond (not illustrated directly in FIG. 17). Various additional traces 126 and pads 128 have been formed as a redistribution layer as part of the system of electrical interconnects.

Following formation of the electrical interconnects, referring to FIG. 18, the array of image sensor die 108, the array of ASIC die 122, and the optically transmissive cover 112 (and any other associated layers) are singulated down to the openings 138 in the patterned layer of adhesive 114 to form openings 132. The singulation may be carried out using any singulation method disclosed in this document. Referring to FIG. 19, the array of image sensor die 108 is illustrated following encapsulation/filling of the openings 132 with a light block material 134, which may be any light block material previously disclosed herein and which may be applied using any of the method of application previously disclosed. Here, openings 136 in the light block material 134 have been formed to expose the pads 128. As in the previously described implementation, the light block material 134 extends over the second largest planar side 138 of the array of image sensor die 108 except where the openings 136 are formed, using the previous definition of image sensor die.

Referring to FIG. 20, the array of image sensor die 108 and the array of ASIC die 122 are illustrated following the formation of bumps 140 into the openings 136. These bumps 140 may be any disclosed in this document formed using any method of bump formation disclosed herein. FIG. 21 illustrates the array of image sensor die 108 following release of the carrier 118 using the temporary release layer 120 and after removal of the patterned adhesive layer 114. A UV release process like that previously described may be employed to release the carrier 118. In various implementations, a solvent cleaning process followed by an oxygen plasma descumming process may be employed to ensure the first largest planar side 116 of the optically transmissive cover 112 is suitable cleaning prior to subsequent processing.

FIG. 22 illustrates image sensor packages 142, 144 following singulation of the light block material 134. Note that in particular implementations, only a single light block material may need to be utilized in this method implementation. As with the previous implementation, the light block material 134 extends across a portion of the first largest planar side 116 of the optically transmissive cover 112 and also across the second largest planar surface 138 of the image sensor die 108 in each package except where the bump openings 136 are present. As previously described, the light block material 134 also extends completely across the edges of the package formed by the edges 146, 148 of the image sensor die 108 and the optically transmissive cover 112, respectively, and any other associated die and other associated layers to completely cover the sides of the packages 142, 144. In this way, the anti-flare capabilities of the light block material can be maximized.

Figure 23:
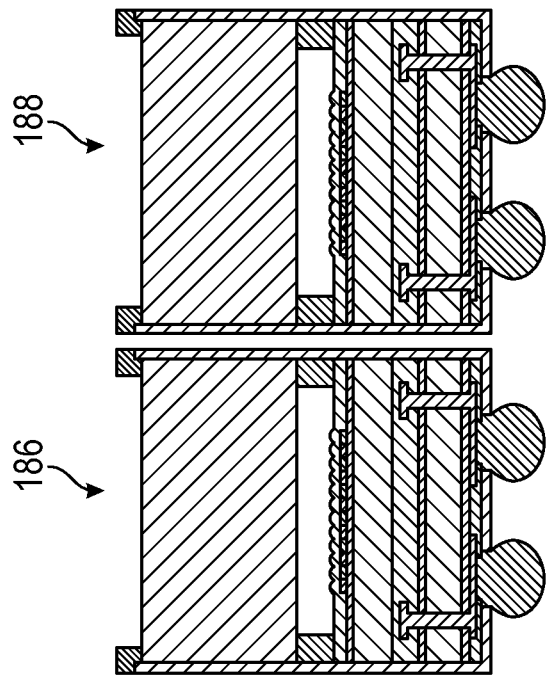
FIG. 23 is a cross sectional view of implementations of image sensors including air gaps and additional light block layer materials.

While the foregoing discussion has involved gapless image sensors and method of forming such gapless image sensors, the principles and processes discuss can apply equally to image sensors with gaps between the optically transmissive cover and the image sensor. Referring to FIG. 23, two implementations of image sensor packages 150, 152 are illustrated where the optically transmissive covers 154, 156 are separated from the microlenses 158, 160 by a gap which may contain air in various implementations. The optically transmissive covers 154, 156 are attached to the image sensor die 162, 164 using adhesive 166, 168. The only change in the two method implementations previously described to allow for the use of the adhesives 166, 168 to form the gaps, is that the use of the low refractive index materials may be omitted entirely and the adhesive is initially patterned over the image sensor array or initially patterned over the optically transmissive cover, then used to bond the optically transmissive cover over the array of image sensor die. Various adhesive curing processes may be included in some method implementations as well. Following the formation of the gap and the bonding/coupling of the optically transmissive cover, the remaining processing operations used to form the various light block materials, electrical connections, etc. previously described can be carried out.

Figure 24:
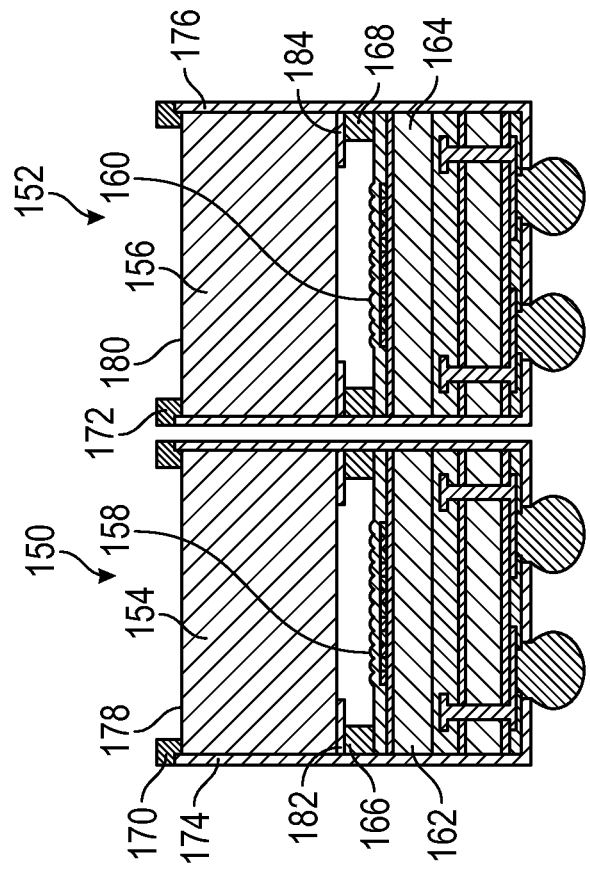
FIG. 24 is a cross sectional view of implementations of image sensors including air gaps.

In the implementations illustrated in FIG. 23, first light block materials 170, 172 and second light block materials 174, 176 have been formed and applied, and then singulated as previously described to form a light block material across a portion of the first largest planar surfaces 178, 180 of the optically transmissive covers 154, 156. In these implementations, a third light block material 182, 184 has been also formed between the adhesive layers 166, 168 and the optically transmissive covers 154, 156. Referring to the implementations of image sensor packages 186, 188 illustrated in FIG. 24, however, no third light block material 182, 184 may be used, similarly to the package implementations illustrated previously. However, as will be discussed later in this document, the previously described gapless image sensors and processes of construction the same may include the additional structure and processing steps used to form and include a third light block material in their structure.

In various implementations, the third light block material (or second light block material, depending on the method implementation) may be located between the optically transmissive cover and the adhesive, or may be located between the adhesive and the image sensor die. Also, while the third light block material 182 is illustrated as extending beyond the extent of the adhesive 166 in FIG. 23, in other implementations, the third light block material may be coextensive with the perimeter or shape of the adhesive or may be smaller than the perimeter or shape of the adhesive layer.

Figure 26:
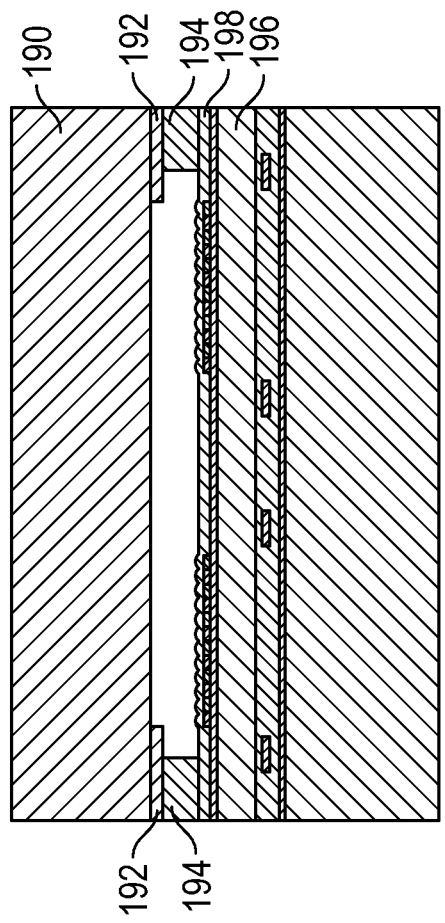
FIG. 26 is a cross sectional view of an implementation of an image sensor with an air gap between an optically transmissive layer and the image sensor die.
Figure 25:
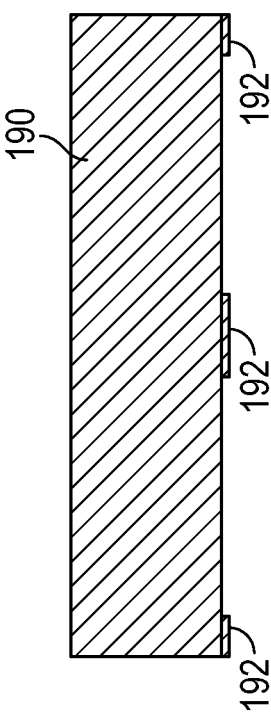
FIG. 25 is a cross sectional view of an implementation of a optically transmissive layer with light block material patterned thereon.

Referring to FIG. 25, an implementation of a optically transmissive cover (array of optically transmissive covers) 190 is illustrated with a pattern of third light block material 192 patterned thereon. The third light block material 192 may be any light block material disclosed in this document and may be patterned (including curing as needed) using any method of patterning light block materials disclosed herein. Following the formation of the pattern of third light block material 192, and referring to FIG. 26, a patterned adhesive layer 194 is formed over the third light block material 192 (or on the surface of the image sensor 196, depending on the method implementation) and then the optically transmissive cover 190 is bonded/coupled to the first largest planar surface 198 of the image sensor 196 (array of image sensors in this case). Either of the two methods of forming and applying light block materials disclosed herein can then be carried out to form packages with first and second light block material structures in addition to the third light block material or packages with first light block material structures and second light block material structure and the corresponding electrical connections including bumps. Those of ordinary skill will readily appreciate how to construct various package and method operations involving image sensors with gaps and/or image sensors with third light block materials using the principles disclosed herein.

Figure 27:
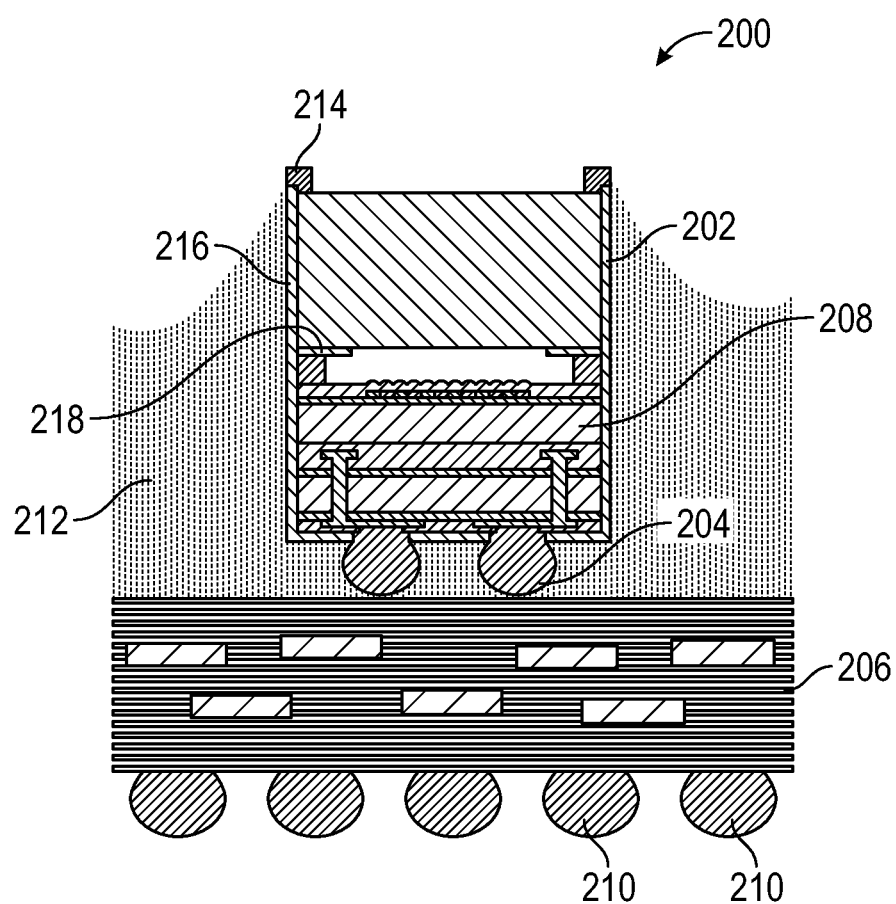
FIG. 27 is a cross sectional view of an implementation of an image sensor package incorporated into a ball grid array package.

Referring to FIG. 27, the various package implementations disclosed herein may be used with other components to form additional package designs like the ball grid array package implementation 200 illustrated. Here, a package 202 like the implementations illustrated in FIG. 12 has been bonded via the bumps 204 to substrate 206 that contains various layers and traces that serve to redistribute out the electrical connections to the image sensor die 208 in the package 202 to additional bumps 210. In various implementations, the bumps 210 may be solder bumps or any other bump type disclosed in this document. An encapsulant 212 has also been included that serves to protect and further attach the package 202 to the substrate as well as, in various implementations, provide an underfill around the bumps 204 to prevent cracking and/or separate of the bumps 204. The particular package design illustrated in FIG. 27 may be utilized in an automotive application. In this implementation, three different light block material layers are illustrated, first light block material 214, second light block material 216, and third light block material 218. These may be formed using any of the methods disclosed in this document. The use of the three light block material layers at the indicated structural locations on the package 202 may provide flare protection on all 5 sides of the die and under and on the edge of the top side. A wide variety of additional packages may be constructed using the principles disclosed herein that incorporate the package designs described herein in additional package types.

In places where the description above refers to particular implementations of image sensor packages and implementing components, sub-components, methods and sub-methods, it should be readily apparent that a number of modifications may be made without departing from the spirit thereof and that these implementations, implementing components, sub-components, methods and sub-methods may be applied to other image sensor packages and related methods.

What is claimed is:

1. An image sensor package comprising:
   an image sensor die comprising a first largest planar side and a second largest planar side;
   an optically transmissive cover comprising a first largest planar side and a second largest planar side, the second largest planar side coupled to the first largest planar side of the image sensor die using an adhesive;
   a light block material that fully covers edges of the image sensor die located between the first largest planar side and the second largest planar side of the image sensor die and fully covers edges of the optically transmissive cover between the first largest planar side and the second largest planar side of the optically transmissive cover; and
   a plurality of bumps surrounded by the light block material;
   wherein the light block material extends across a portion of the first largest planar side of the optically transmissive cover;
   wherein a width of the first largest planar side of the optically transmissive cover is equal to a width of the second largest planar side of the optically transmissive cover;
   wherein an entirety of the first largest planar side of the optically transmissive cover is planar; and
   wherein the light block material extends across a portion of the second largest planar side of the image sensor die.

2. The package of claim 1, further comprising a second light block material that extends across a portion of the second largest planar side of the optically transmissive cover.

3. The package of claim 1, further comprising a microlens array wherein the microlens array is formed only of an organic material.

4. The package of claim 1, wherein the light block material extends fully across the entire second largest planar side of the image sensor die except at a location of each of the plurality of bumps.

5. The package of claim 1, wherein the plurality of bumps are electrically coupled with the image sensor portion of the image sensor die through one or more through silicon vias and a redistribution layer.

6. The package of claim 1, further comprising a second die bonded to the second side of the image sensor die and wherein the light block material fully covers edges of the second die located between a first largest planar side and a second largest planar side of the second die.

7. An image sensor package comprising:
   an image sensor die comprising a first largest planar side and a second largest planar side;

an optically transmissive cover comprising a first largest planar side and a second largest planar side opposite the first largest planar side, the second largest planar side coupled to the first largest planar side of the image sensor die using an adhesive;

an air gap coupled between the optically transmissive cover and the image sensor die; and a light block material that fully covers edges of the image sensor die located between the first largest planar side and the second largest planar side of the image sensor die and fully covers edges of the optically transmissive cover between the first largest planar side and the second largest planar side of the optically transmissive cover;

wherein a width of the first largest planar side of the optically transmissive cover is equal to a width of the second largest planar side of the optically transmissive cover;

wherein an entirety of the first largest planar side of the optically transmissive cover is planar;

wherein the light block material extends across a portion of the first largest planar side of the optically transmissive cover; and wherein the light block material extends across a portion of the second largest planar side of the image sensor die.

8. The package of claim 7, further comprising a second light block material that extends across a portion of the second largest planar side of the optically transmissive cover.

9. The package of claim 7, further comprising a microlens array wherein the microlens array is formed only of an organic material.

10. The package of claim 7, further comprising a plurality of bumps surrounded by the light block material.

11. The package of claim 7, wherein the light block material extends fully across the entire second largest planar side of the image sensor die except at a location of each of a plurality of bumps.

12. The package of claim 7, wherein a plurality of bumps are electrically coupled with the image sensor portion of the image sensor die through one or more through silicon vias and a redistribution layer.

13. The package of claim 7, further comprising a second die bonded to the second side of the image sensor die and wherein the light block material fully.

14. An image sensor package comprising:
an image sensor die comprising a first largest planar side and a second largest planar side;
an optically transmissive cover comprising a first largest planar side and a second largest planar side, the second largest planar side coupled to the first largest planar side of the image sensor die using an adhesive;

a low refractive index layer coupled between the adhesive and the image sensor die; and a light block material that fully covers edges of the image sensor die located between the first largest planar side and the second largest planar side of the image sensor die and fully covers edges of the optically transmissive cover between the first largest planar side and the second largest planar side of the optically transmissive cover;

wherein the semiconductor package is a gapless image sensor package;

wherein the light block material extends across a portion of the first largest planar side of the optically transmissive cover; and wherein the light block material extends across a portion of the second largest planar side of the image sensor die.

15. The package of claim 14, further comprising a microlens array wherein the microlens array is formed only of an organic material. covers edges of the second die located between a first largest planar side and a second largest planar side of the second die.

16. The package of claim 14, wherein a plurality of bumps are electrically coupled with the image sensor portion of the image sensor die through one or more through silicon vias and a redistribution layer.

17. The package of claim 1, wherein the light blocking material comprises a first portion coupled to an entirety of a sidewall of the optically transmissive cover and a second portion that extends across the first largest planar side of the optically transmissive cover, wherein the first portion and the second portion of the light blocking material are separately formed.

18. The package of claim 6, wherein a widest width of the second die, a widest width of the image sensor die, and a widest width of the optically transmissive cover are all equal.

19. The package of claim 7, wherein the light blocking material comprises a first portion coupled to an entirety of a sidewall of the optically transmissive cover and a second portion that extends across the first largest planar side of the optically transmissive cover, wherein the first portion and the second portion of the light blocking material are separately formed.

20. The package of claim 14, wherein a widest width of the second die, a widest width of the image sensor die, and a widest width of the optically transmissive cover are all equal.

* * * * *